United States Patent
Lee et al.

(10) Patent No.: US 6,900,102 B2
(45) Date of Patent: May 31, 2005

(54) METHODS OF FORMING DOUBLE GATE ELECTRODES USING TUNNEL AND TRENCH

(75) Inventors: Byeong-Chan Lee, Yongin-si (KR); Si-Young Choi, Sungnam-si (KR); Jong-Ryeol Yoo, Osan-si (KR); Deok-Hyung Lee, Yongin-si (KR); In-Soo Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/773,022

(22) Filed: Feb. 5, 2004

(65) Prior Publication Data

US 2004/0157396 A1 Aug. 12, 2004

(30) Foreign Application Priority Data

Feb. 10, 2003 (KR) ................... 10-2003-0008080

(51) Int. Cl.[7] ............................. H01L 21/336
(52) U.S. Cl. ................ 438/282; 438/281; 438/283; 438/284
(58) Field of Search ................. 438/281, 282, 438/283, 284, 197, 301, 152, 626, 694, 666

(56) References Cited

U.S. PATENT DOCUMENTS

| | | | |
|---|---|---|---|
| 6,020,257 A | * | 2/2000 | Leedy ..................... 438/626 |
| 6,458,662 B1 | | 10/2002 | Yu |
| 2002/0114191 A1 | * | 8/2002 | Iwata et al. ............... 257/316 |
| 2004/0016968 A1 | * | 1/2004 | Coronel et al. ........... 438/282 |
| 2004/0063286 A1 | * | 4/2004 | Kim et al. ................. 438/283 |
| 2004/0087162 A1 | * | 5/2004 | Vogeli ...................... 438/694 |
| 2004/0108523 A1 | * | 6/2004 | Chen et al. ............... 257/202 |
| 2004/0140520 A1 | * | 7/2004 | Kim et al. ................. 438/152 |
| 2004/0157396 A1 | * | 8/2004 | Lee et al. ................. 438/283 |
| 2004/0209463 A1 | * | 10/2004 | Kim et al. ................. 438/666 |

FOREIGN PATENT DOCUMENTS

JP 2001-102590 A 4/2001

* cited by examiner

*Primary Examiner*—Michael S. Lebentritt
*Assistant Examiner*—Walter L. Lindsay, Jr.
(74) *Attorney, Agent, or Firm*—Myers Bigel Sibley & Sajovec

(57) ABSTRACT

A double gate electrode for a field effect transistor is fabricated by forming in a substrate, a trench and a tunnel that extends from a sidewall of the trench parallel to the substrate. An insulating coating is formed inside the tunnel. A bottom gate electrode is formed within the insulating coating inside the tunnel. An insulating layer is formed on the substrate and a top gate electrode is formed on the insulating layer opposite the bottom gate electrode.

28 Claims, 25 Drawing Sheets

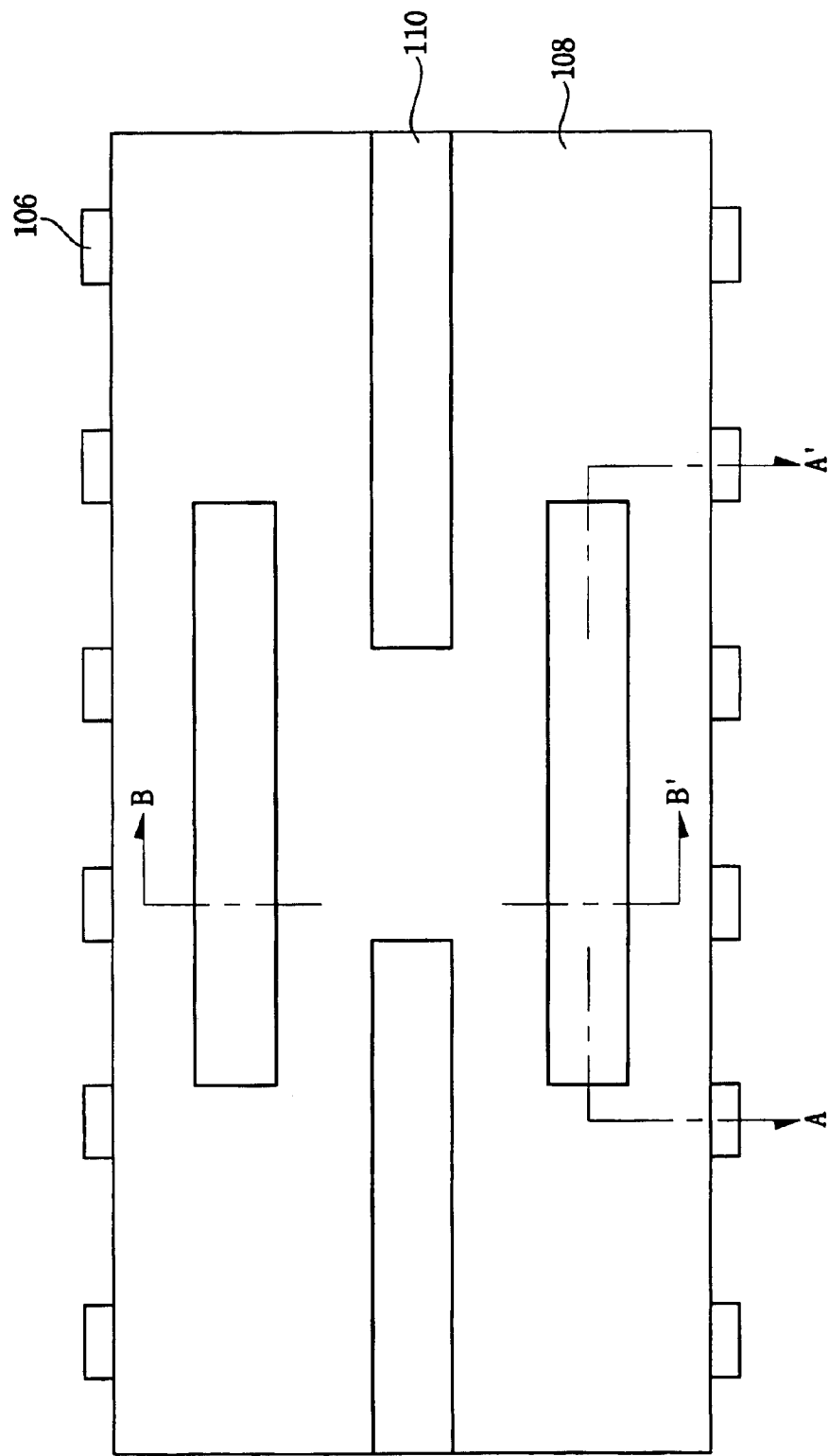

METHODS OF FORMING DOUBLE GATE ELECTRODES USING TUNNEL AND TRENCH

RELATED APPLICATION

This application claims the benefit of Korean Patent Application No. 2003-0008080, filed Feb. 10, 2003, the disclosure of which is hereby incorporated herein by reference in its entirety as if set forth fully herein.

FIELD OF THE INVENTION

This invention relates to semiconductor device fabrication methods, and more particularly to methods of forming insulated gate field effect transistors, also referred to as Metal Oxide Semiconductor (MOS) transistors.

BACKGROUND OF THE INVENTION

Integrated circuit MOS transistors are widely used in integrated circuit devices, such as logic, memory and/or processor devices. For example, MOS transistors are widely used in Dynamic Random Access Memory (DRAM) devices.

Referring to FIG. 1, a conventional MOS transistor includes spaced apart source and drain regions 16a and 16b in an integrated circuit substrate 10, with an insulated gate electrode that includes a gate oxide 12 and a gate electrode 14 therebetween. A gate sidewall spacer 18 also may be included. In operation, a channel is formed in the substrate 10, between the source and drain regions 16a and 16b beneath the gate oxide 12.

As the integration density of MOS devices continues to increase, the channel length may decrease to submicron dimensions. These short channel devices may create various undesirable short channel effects, such as punch-through.

In order to reduce short channel and/or other effects, double-gated MOS transistors have been developed. In a double-gated MOS transistor, a bottom gate and a top gate may be formed on opposite sides of the channel region.

U.S. Pat. No. 6,458,662 to Yu, entitled *Method of Fabricating a Semiconductor Device Having an Asymmetrical Dual-Gate Silicon-Germanium (SiGe) Channel MOSFET and a Device Thereby Formed*, describes a method of fabricating a semiconductor device, having an asymmetrical dual-gate MOSFET with a silicon-germanium (SiGe) channel, involving: patterning a silicon-on-insulator (SOI) wafer with a photoresist layer, wherein the SOI structure comprises a silicon dioxide ($SiO_2$) layer, a silicon (Si) layer deposited on the $SiO_2$ layer, and a silicon nitride ($Si_3N_4$) layer deposited on the Si layer; initiating formation of a SiGe/Si/SiGe sandwich fin structure from the SOI structure; completing formation of the SiGe/Si/SiGe sandwich fin structure; depositing a thick gate material layer on the SiGe/Si/SiGe sandwich fin structure; forming an asymmetrical dual-gate; and completing fabrication of the semiconductor device, and a device thereby formed. See the Yu Abstract.

Moreover, Japanese Laid-Open Publication No. 2001-102590 describes a double gate field effect transistor that comprises a lower gate electrode, a lower gate insulating film, a channel layer, a gate insulation film, and an upper gate electrode. An electrode material, serving as a lower gate, is sandwiched at the time of wafer bonding using a wafer bonding technology. Other process is similar to existing process for fabricating silicon integrated circuit in the fabrication of a semiconductor device, e.g., a double gate field effect transistor. See the English language Abstract of Japanese Laid-Open Publication No. 2001-102590.

SUMMARY OF THE INVENTION

Some embodiments of the present invention form a double gate electrode for a field effect transistor by forming in a substrate, a trench and a tunnel that extends from a sidewall of the trench parallel to the substrate. An insulating coating is formed inside the tunnel. A bottom gate electrode is formed within the insulating coating inside the tunnel. An insulating layer is formed on the substrate and a top gate electrode is formed on the insulating layer opposite the bottom gate electrode.

In some embodiments, the trench and tunnel are formed by forming a dummy bottom gate on the substrate, forming a semiconductor channel region on the dummy bottom gate, forming a trench that extends through a portion of the semiconductor channel region and the dummy bottom gate, and etching the dummy bottom gate to define the tunnel. Moreover, in some embodiments, the substrate comprises a single element semiconductor, such as silicon, and the dummy bottom gate is formed through forming a dummy bottom gate trench in the substrate and epitaxially growing a compound semiconductor, such as silicon-germanium, into the dummy bottom gate trench from the single element semiconductor. In still other embodiments, the semiconductor channel region is formed by epitaxially growing the single element semiconductor on the compound semiconductor.

In yet other embodiments, prior to forming a bottom gate electrode, the trench is filled up to a floor of the tunnel. Moreover, the bottom gate electrode is formed within the insulating coating inside the tunnel and on the trench that was filled up to the floor of the tunnel.

In other embodiments of the present invention, a double gate electrode is fabricated by forming a tunnel structure in an active region of a substrate that is defined by a trench positioned in an isolation region of the substrate. The tunnel structure extends substantially parallel to the substrate. A first insulation layer is formed inside the tunnel structure and inside the trench. A bottom gate electrode is formed on the first insulation layer inside the tunnel structure, the bottom gate electrode extending into the trench. A second insulation layer is formed on the active region of the substrate. A top gate electrode is formed on the second insulation layer opposite the tunnel structure.

In any of the above-described embodiments, source and drain regions may be formed through implanting impurities into the substrate to provide a MOS transistor. In a DRAM, a bit line may be formed that is electrically connected to the source region, and a capacitor may be formed that is electrically connected to the drain region.

BRIEF DESCRIPTION OF THE DRAWINGS

FIG. 7 is a plain view illustrating a MOS device having a silicon substrate where a second mask pattern is formed according to embodiments of the present invention;

DETAILED DESCRIPTION

Figure 1:
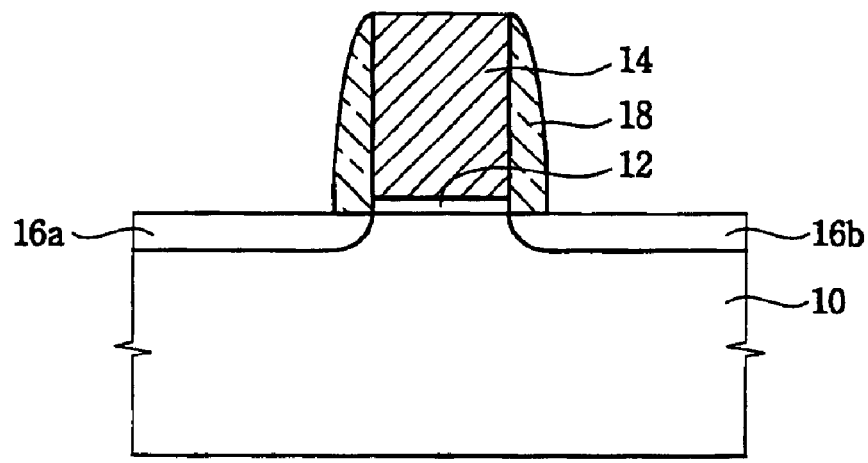
FIG. 1 is a cross sectional view illustrating a conventional MOS transistor.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. It will also be understood that when an element is referred to as being "connected" or "coupled" to another element, it can be directly connected or coupled to the other element or intervening elements may be present. Finally, the term "directly" means that there are no intervening elements.

FIGS. 2–5, 6A and 6B are cross-sectional views illustrating methods for manufacturing a MOS device having a double gate electrode according to some embodiments of the present invention.

Figure 2:
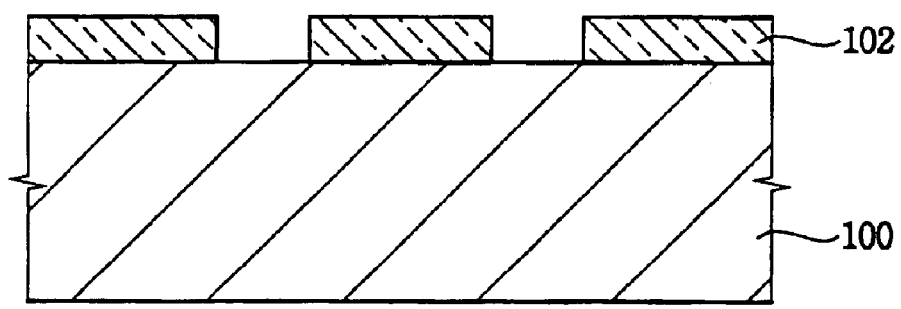
FIGS. 2–6B are cross sectional views illustrating methods for manufacturing a MOS device having a double gate electrode according to some embodiments of the present invention.

Referring to FIG. 2, a first silicon nitride layer is formed on a substrate, such as a substrate 100 of single crystalline silicon. The first silicon nitride layer is etched to form a first mask pattern 102 selectively exposing a bottom gate region of the silicon substrate 100 where a bottom gate pattern will be formed.

Figure 3:
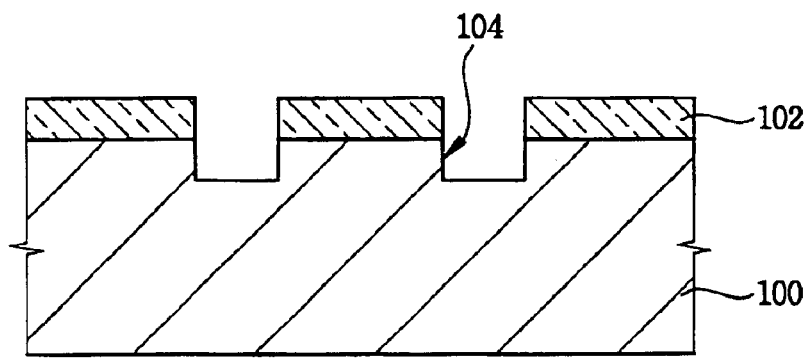

Referring to FIG. 3, a bottom gate region area 104, which may also be referred to herein as a bottom gate trench, is defined by anisotropically etching portions of the silicon substrate 100 using the first mask pattern 102 as an etching mask. Generally, in a MOS transistor employed for a DRAM device, a bottom gate of the transistor is formed to have a line shape. Since the bottom gate has the line shape, the bottom gate region 104 is formed to have a linear trench shape. The etched depth of the silicon substrate 100 may be substantially similar to a thickness of the bottom gate pattern. For example, when the bottom gate pattern has a thickness of about 50 Å to about 2,000 Å, the etched depth of the silicon substrate 100 is about 50 Å to about 2,000 Å. When the etched depth of the silicon substrate 100 is too shallow, the bottom gate pattern may not be adequately formed. On the other hand, a material for the bottom gate pattern may not fill up the etched portion of the silicon substrate 100 when the etched depth of the silicon substrate 100 is relatively deep.

Figure 4:
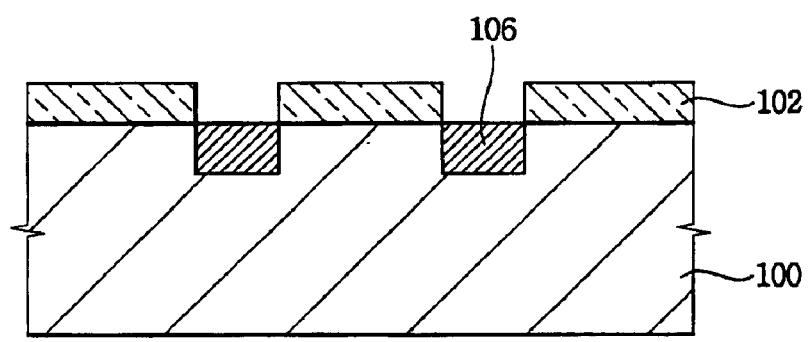

Referring to FIG. 4, a dummy bottom gate pattern 106 is formed in the bottom gate region 104. The dummy bottom gate pattern 106 is formed using material having etching selectivity relative to silicon. For example, the etching selectivity between the material for the dummy bottom gate pattern 106 and silicon may be more than about 1:10. In some embodiments, the dummy bottom gate pattern 106 is formed using silicon-germanium (Si—Ge). In one embodiment, the dummy bottom gate pattern 106 includes a silicon-germanium pattern. Because the silicon-germanium includes silicon, a silicon channel layer having a good crystalline structure may be formed, as will be described below.

The silicon-germanium pattern is formed by epitaxially growing silicon-germanium from silicon included in the silicon substrate 100. That is, the silicon-germanium pattern is formed using silicon included in the bottom gate region 104 as a seed. In one embodiment of the present invention, the silicon-germanium pattern includes $Si_{1-x}Ge_x$ material, where $0<X$ 1. In some embodiments, X is in a range of about 0.01 to about 0.5. Considering the etching selectivity between the silicon-germanium pattern and silicon, in some embodiments X is in a range of about 0.1 to about 0.5.

Figure 5:
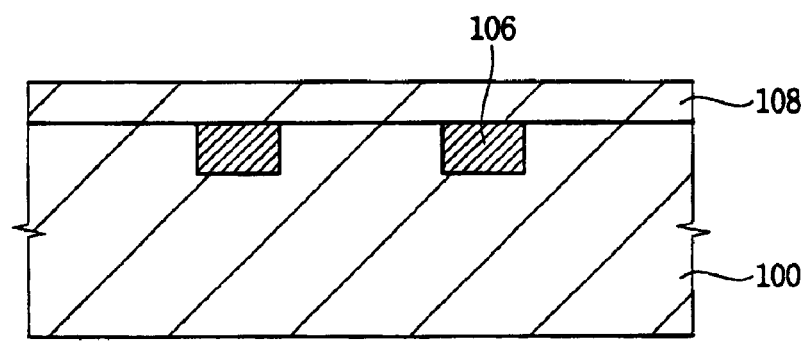

Referring to FIG. 5, the first mask pattern 102 is removed to expose the dummy bottom gate pattern 106 and the silicon substrate 100. Then, the silicon channel layer 108 is formed on the silicon substrate 100 including the dummy bottom gate pattern 106 of silicon-germanium. The silicon channel layer 108 may be formed by epitaxially growing silicon from the silicon substrate 100 and the dummy bottom gate pattern 106. The silicon channel layer 108 serves as a channel of a MOS transistor. For example, the silicon channel layer 108 has a thickness of about 50 Å to about 1,000 Å in some embodiments.

If the silicon channel layer 108 is too thin, the channel of the transistor may not be formed due to consumption of silicon thereof during a subsequent process such as a process of forming a gate insulation layer. Alternatively, when the silicon channel layer 108 is too thick, desired electrical characteristics of the transistor adjusted by a double gate electrode may not be provided.

Figure 6A:
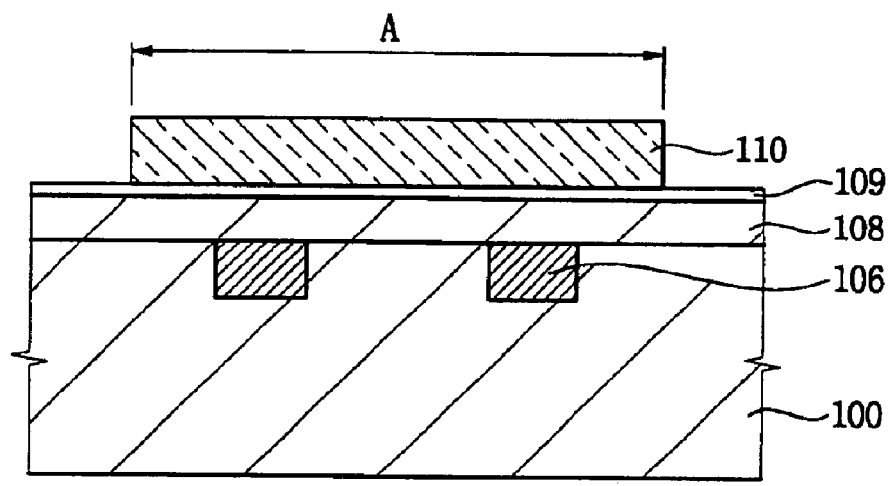
Figure 6B:
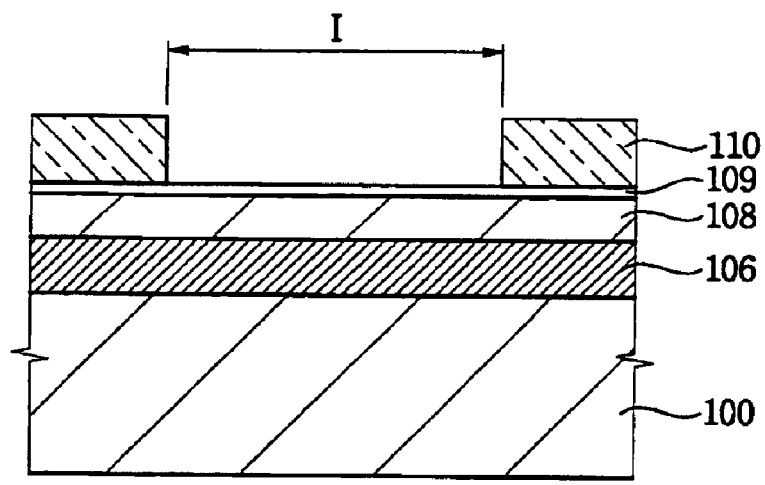

Referring to FIGS. 6A and 6B, a thin native oxide layer 109 is formed on the silicon channel layer 108 and a second silicon nitride layer is formed on the silicon channel layer 108. Then, the second silicon nitride layer is etched to form a second mask 110 that masks an active region A of the silicon substrate 100. That is, a second mask pattern 110 exposes a portion of the silicon substrate 100 that corresponds to an isolation or field region I. The active region A is located in a perpendicular direction relative to the dummy bottom gate pattern 106.

FIG. 7 is a plan view illustrating a MOS device having a silicon substrate where the second mask pattern 110 is formed according to some embodiments of the present invention. FIGS. 8A–12B are cross-sectional views illustrating methods for manufacturing the MOS device having a double gate electrode according to embodiments of the present invention. FIGS. 6A, 8A, 9A, 10A, 11A and 12A are cross-sectional views illustrating the MOS device taken along line of A–A' in FIG. 7. FIGS. 6B, 8B, 9B, 10B, 11B and 12B are cross-sectional views illustrating the DRAM device taken along line of B–B' in FIG. 7.

Figure 8A:
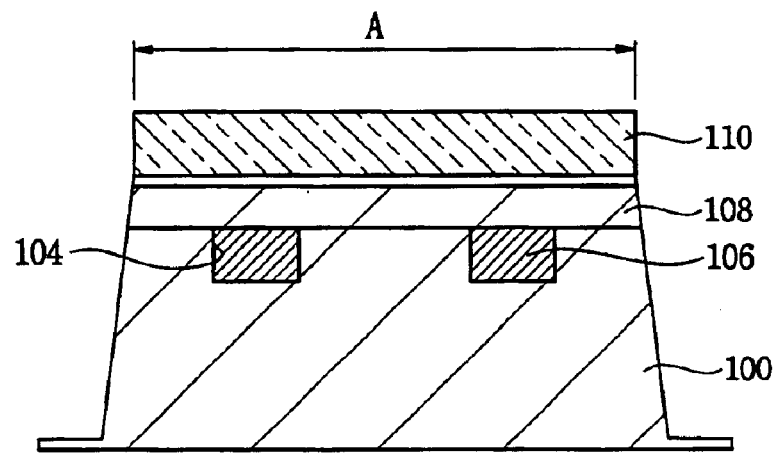
FIGS. 8A–12B are cross-sectional views illustrating methods for manufacturing a MOS device having a double gate electrode according to some embodiments of the present invention.
Figure 8B:
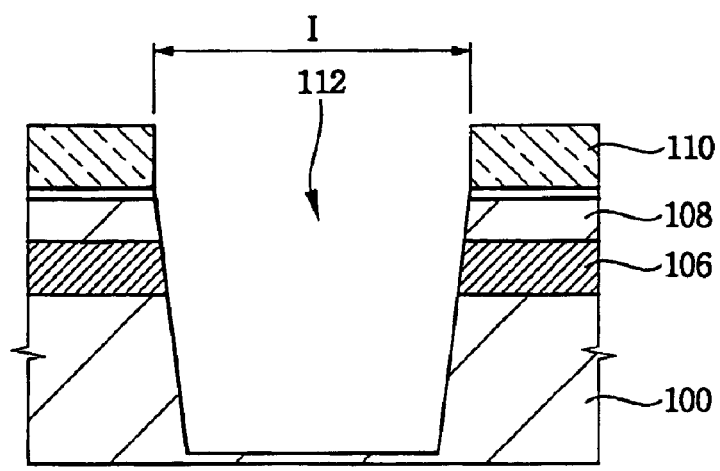

Referring to FIGS. 8A and 8B, the silicon channel layer 108, the dummy bottom gate pattern 106 and the silicon substrate 100 are successively etched using the second mask pattern 110 as an etching mask, thereby forming a trench 112 in the silicon substrate 100. Here, the dummy bottom gate pattern 106 is exposed through a sidewall of the trench 112.

Figure 9A:
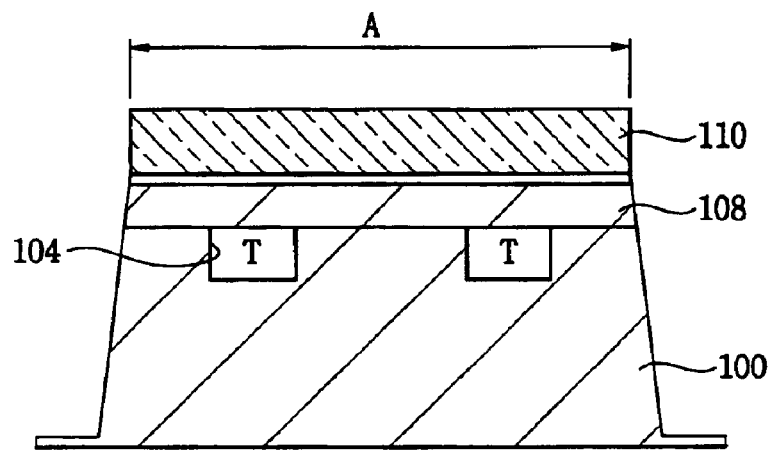
Figure 9B:
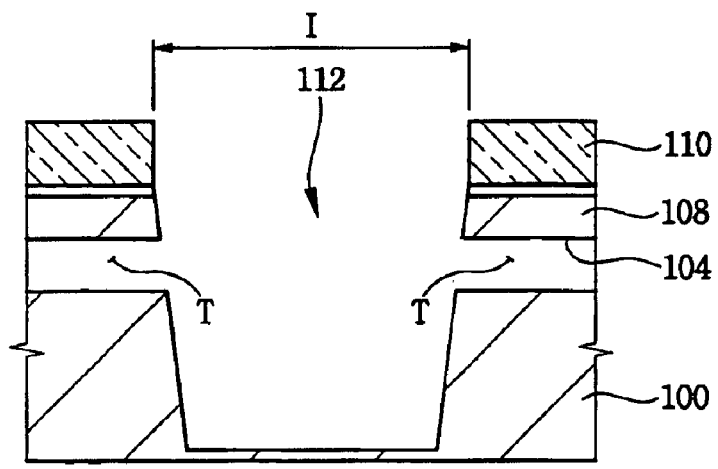

Referring to FIGS. 9A and 9B, the dummy bottom gate pattern 106 remaining in the bottom gate region 104 is isotropically etched. In the isotropic etching process for removing the dummy bottom gate pattern 106, the dummy bottom gate pattern 106 is selectively etched while silicon included in the silicon substrate 100 and the silicon channel layer 108 is not etched or is etched relatively little. The dummy bottom gate pattern 106 may be rapidly etched. The isotropic etching process is carried out using a dry etching process and/or a wet etching process. When the dummy bottom gate pattern 106 of silicon-germanium is selectively etched, a cavity is formed at a position where the dummy bottom gate pattern 106 existed. As a result, the bottom gate region 104 has a tunnel structure T in accordance with the formation of the cavity.

Accordingly, FIGS. 2–9 illustrate forming in a substrate, a trench and a tunnel that extends from a sidewall of the trench, parallel to the substrate, according to some embodiments of the present invention. FIGS. 2–9 also illustrate forming a tunnel structure in an active region of a substrate that is defined by a trench positioned in an isolation region of the substrate, the tunnel structure extending substantially parallel to the substrate, according to some embodiments of the present invention.

Figure 10A:
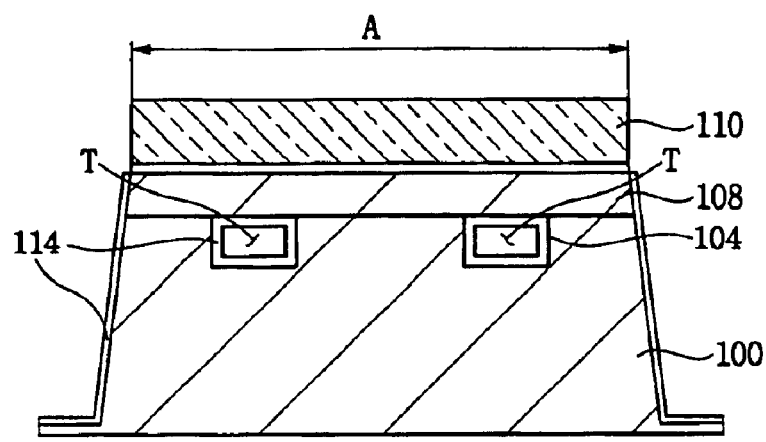
Figure 10B:
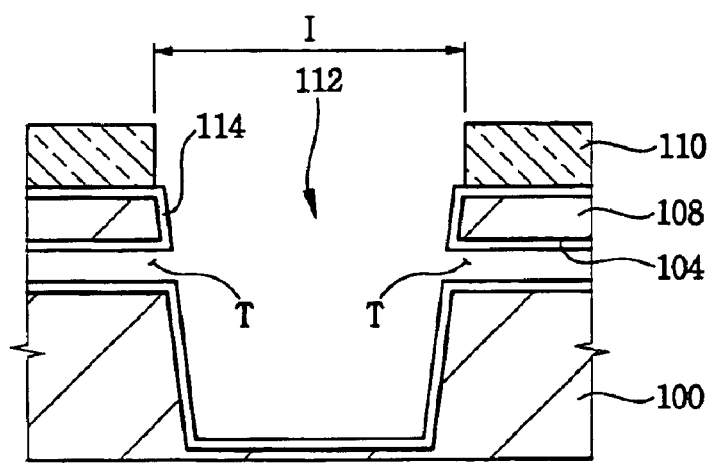

Referring to FIGS. 10A and 10B, a first silicon oxide layer 114 is formed in the bottom gate region 104 of the tunnel structure and on the bottom face and the sidewall of the trench 112. The first silicon oxide layer 114 is also formed on the sidewalls of the silicon substrate 100 and the silicon channel layer 108. The first silicon oxide layer 114 formed in the bottom gate region 104 of the tunnel structure serves as a bottom gate oxide layer. The first silicon oxide layer 114 has a thickness that can be adjusted in accordance with the thickness of the bottom gate region 104 and/or the designed characteristics of the MOS transistor. In some embodiments, the first silicon oxide layer 114 has a thickness of about 10 Å to about 200 Å. Additionally, the first silicon oxide layer 114 can function as a trench sidewall oxide layer that can cure the inner surface of the trench 112 that may be damaged during subsequent etching processes. In order to cure the inner surface of the trench 112, the first silicon oxide layer 114 may be formed using a thermal oxidation process in which silicon contained in the silicon substrate 100 reacts with oxygen under an oxygen atmosphere. Accordingly, FIGS. 10A and 10B illustrate forming an insulating coating inside the tunnel, according to some embodiments of the invention.

Figure 11A:
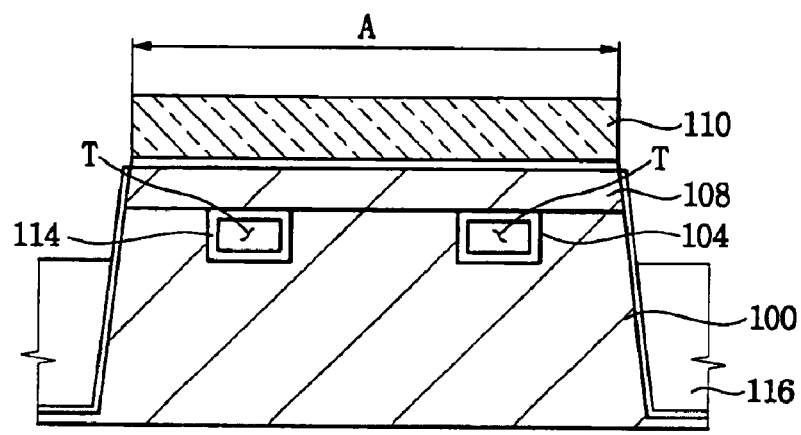
Figure 11B:
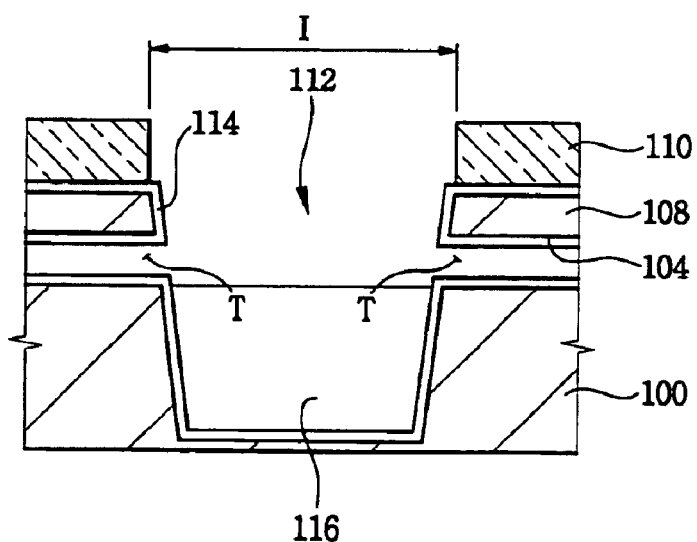

Referring to FIGS. 11A and 11B, an insulation material is formed on the first silicon oxide film 114 to fill up the trench 112. For example, the insulation material includes silicon oxide.

Then, a first insulation layer 116 is formed through etching the insulation material. The first insulation layer 116 is formed at a portion of the trench 112 beneath the bottom gate region 104 of the tunnel structure. Simultaneously, the exposed portions of the first silicon oxide layer 114 are removed with the etching process.

Figure 12A:
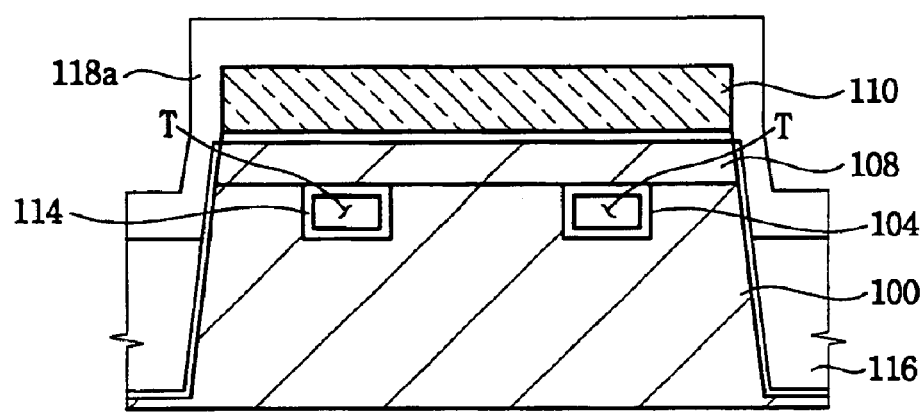
Figure 12B:
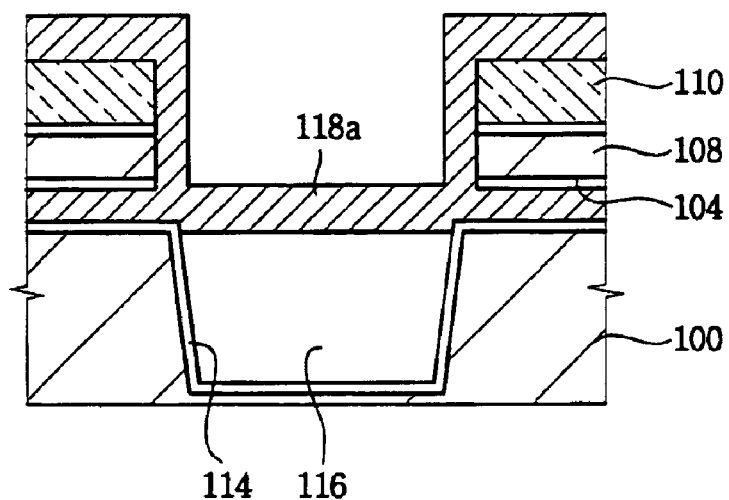

Referring to FIGS. 12A and 12B, a conductive material is formed in the bottom gate region 104, on the second mask pattern 110, on the first insulation layer 116 and on the sidewall of the trench 112, thereby forming a first bottom gate conductive layer 118a. In particular, in some embodiments, the conductive material is continuously formed on the first insulation layer 116 and the sidewall of the trench 112 to fill the bottom gate region 104 of the tunnel structure. As shown, in some embodiments, the bottom gate region 104 of the tunnel structure is completely filled with the first bottom gate conductive layer 118a. For example, the first bottom gate conductive layer 118a may include polysilicon, tungsten, tungsten silicide, titanium silicide, titanium nitride and/or tungsten nitride.

Accordingly, FIG. 12 illustrates forming a bottom gate electrode within the insulating coating inside the tunnel, according to some embodiments of the present invention. FIG. 12 also illustrates forming a bottom gate electrode on the first insulation layer inside the tunnel structure, the bottom gate electrode extending into the trench, according to other embodiments of the present invention.

FIGS. 13A–18B are partially cut perspective views illustrating methods for manufacturing a MOS device having a double gate electrode in accordance with some embodiments of the present invention. FIGS. 13A, 14A, 15A, 16A, 17A and 18A are partially cut perspective views taken along line of A–A' in FIG. 7. FIGS. 13B, 14B, 15B, 16B, 17B and 18B are partially cut perspective views taken along line of B–B' in FIG. 7.

Figure 13A:
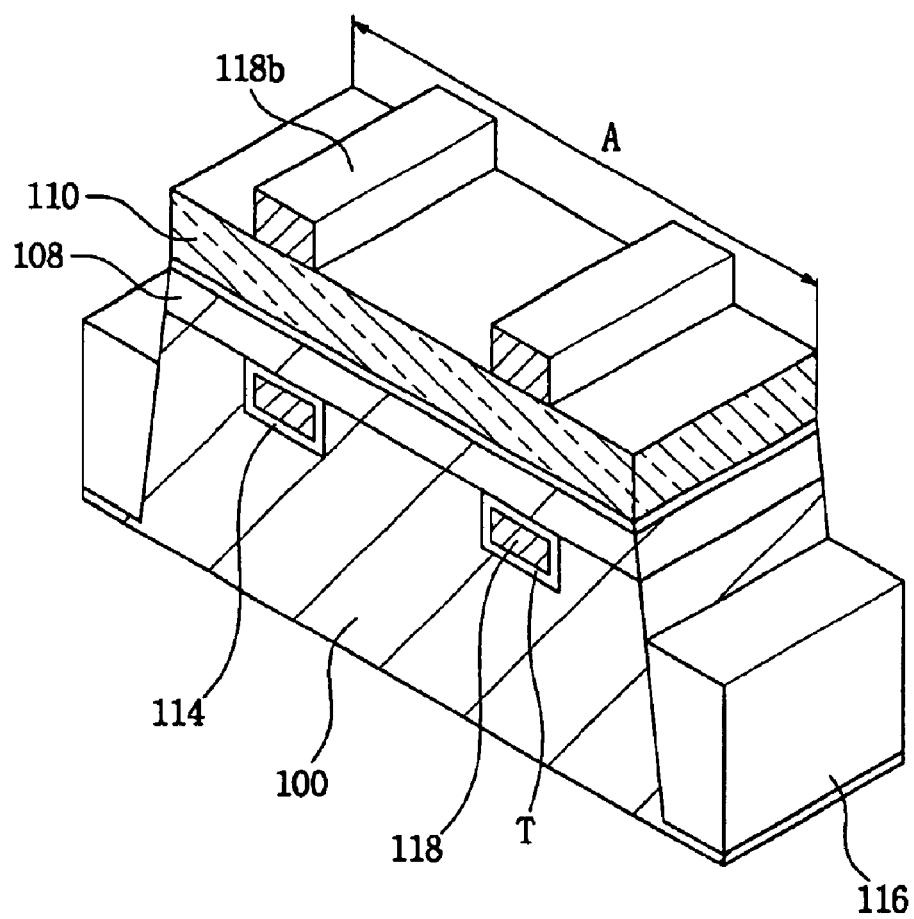
FIGS. 13A–18B are partially cut perspective views illustrating methods for manufacturing a MOS device having a double gate electrode according to some embodiments of the present invention.
Figure 13B:
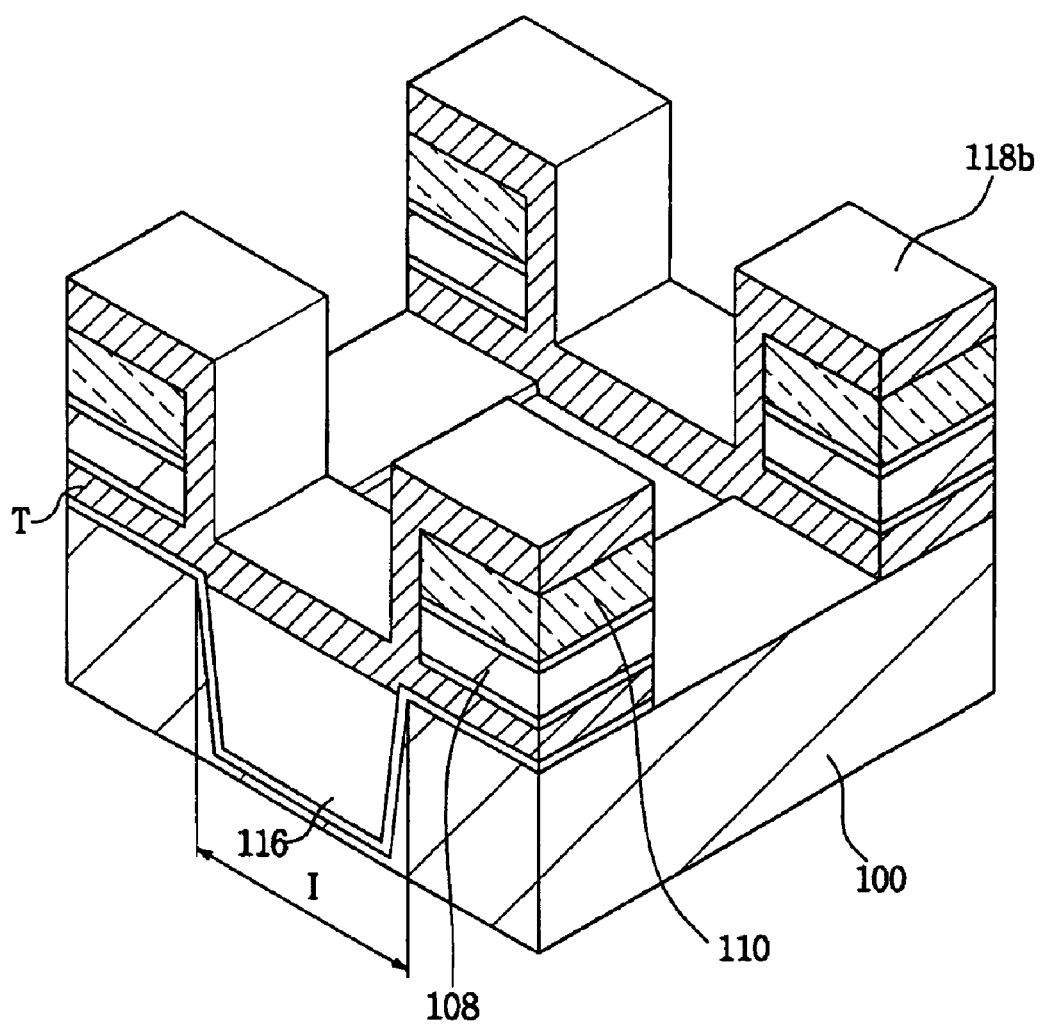

Referring to FIGS. 13A and 13B, a second bottom gate conductive layer 118b is formed by etching the first bottom gate conductive layer 118a. The second bottom gate conductive layer 118b is formed at a position where a bottom gate pattern 118 will be formed. However, the bottom gate pattern 118 may not be completely formed by this etching process while an undesired conductive material remains on the second mask pattern 110 and on the sidewall of the trench 112.

Figure 14A:
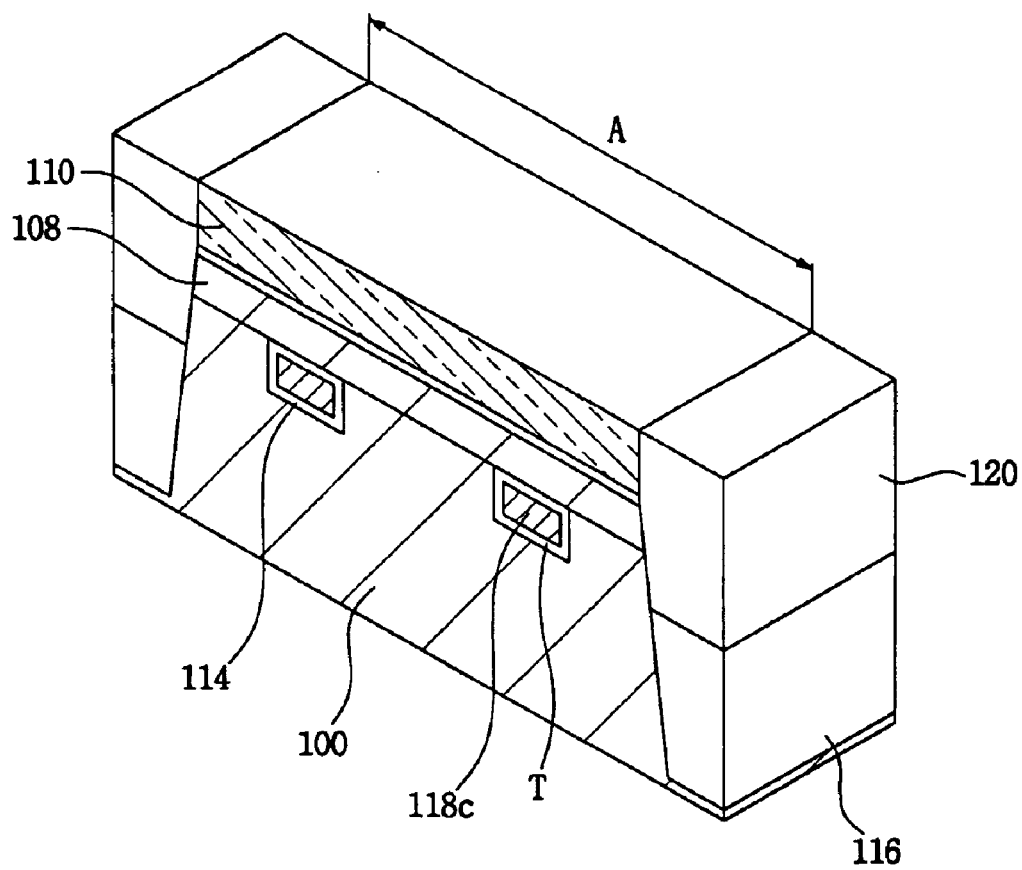
Figure 14B:
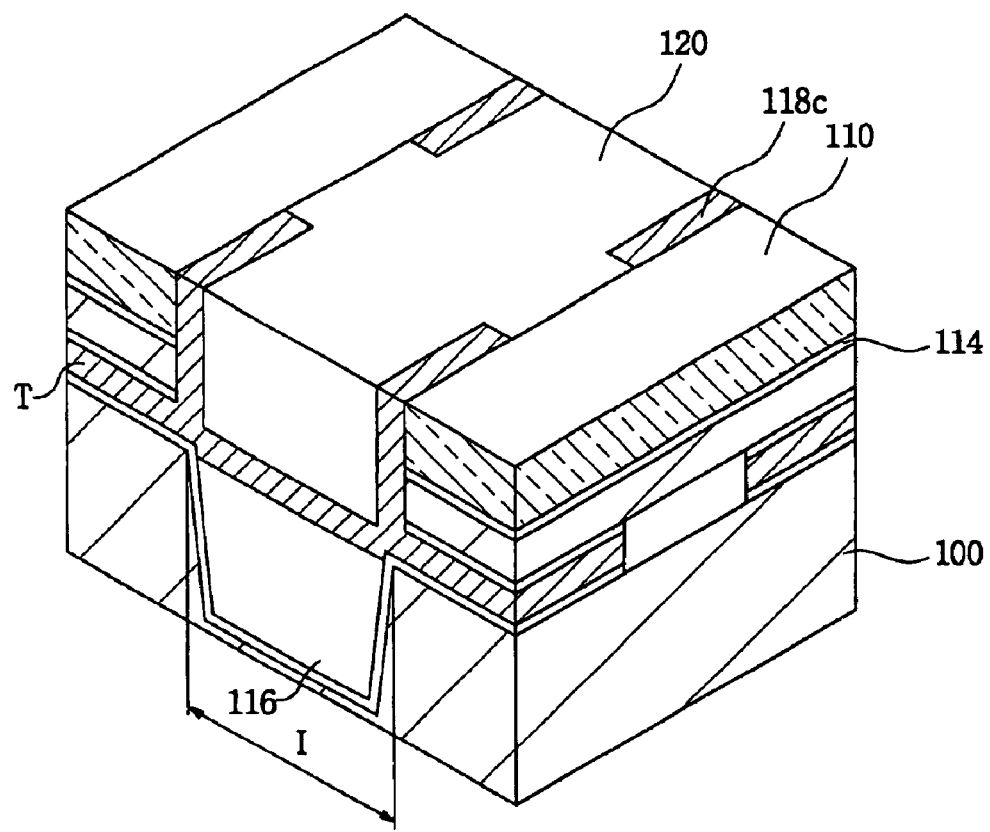

Referring to FIGS. 14A and 14B, an insulation material is formed on the second bottom gate conductive layer 118c to completely fill the trench 112. For example, the insulation material may include silicon oxide. In addition, the insulation material may be formed using a Chemical Vapor Deposition (CVD) process.

The insulation material and the second bottom gate conductive layer 118a are polished to thereby form a third bottom gate conductive layer 118c and a second insulation layer 120 on the first insulation layer 116 and in the trench 112. The undesired conductive material on the second mask pattern 110 is removed during this polishing process.

Figure 15A:
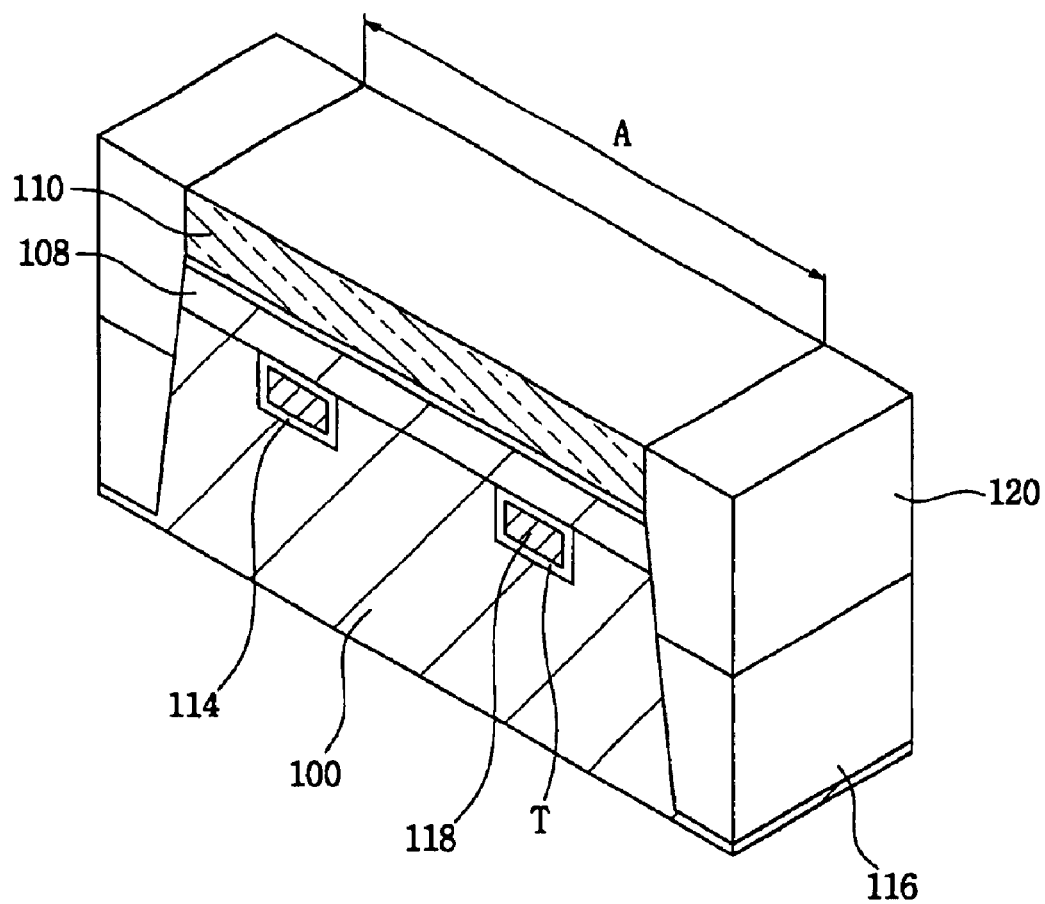
Figure 15B:
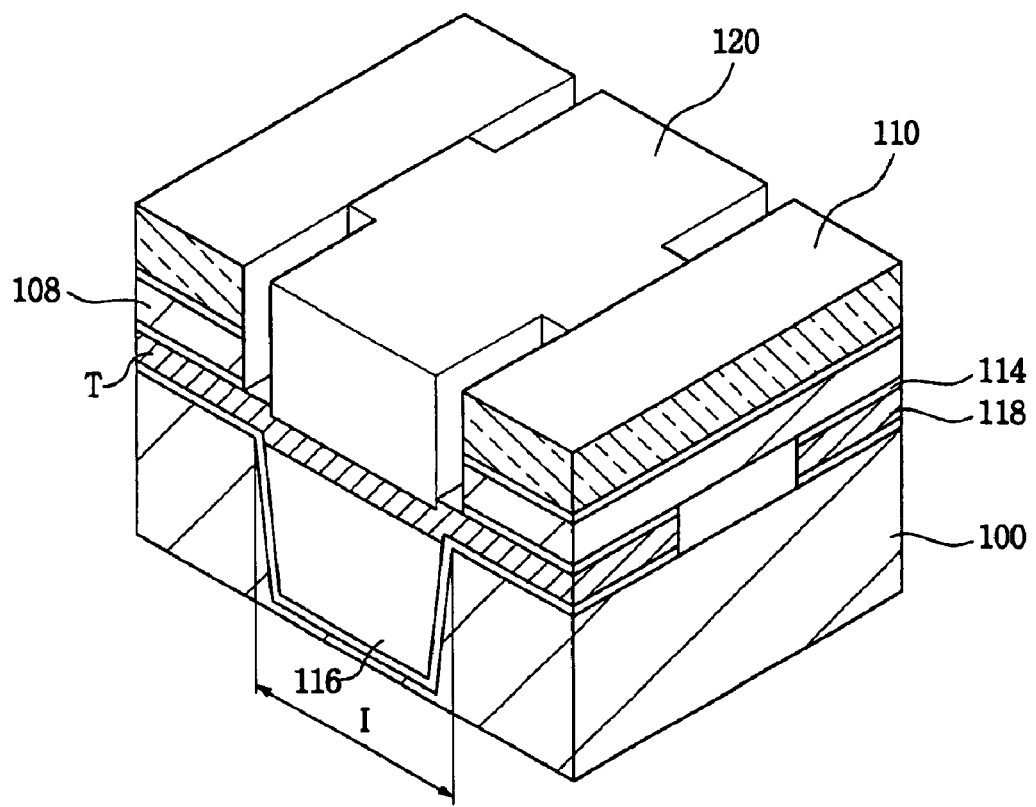

Referring to FIGS. 15A and 15B, the bottom gate pattern 118 is completed by partially etching the third bottom gate conductive layer 118c remaining on the sidewall of the trench 112. The bottom gate pattern 118 has a tunnel structure through the trench 112 and the active region of the substrate 100. In addition, the bottom gate pattern 118 has a cross-section of a line shape.

When the third bottom gate conductive layer 118c is too deeply etched, the bottom gate pattern 118 may be cut or the resistance of bottom gate pattern 118 may be increased. Therefore, the third bottom gate conductive layer 118c may be etched so that the third bottom gate conductive layer 118c remaining on the sidewall of the trench 112 is higher than the top face of the bottom gate region 104. This etching process may be performed using a wet etching process and/or a dry etching process.

When the third bottom gate conductive layer 118c includes polysilicon, the third bottom gate conductive layer 118c can be etched by a thermal desorption silicon etching (TDSE) process. The TDSE process may reduce and/or eliminate plasma damage to the third bottom gate conductive layer 118c because the third bottom gate conductive layer 118c is etched using an etching gas through a chemical desorption. For example, the etching gas for the TDSE process may include $Cl_2$ and/or HCl.

Figure 16A:
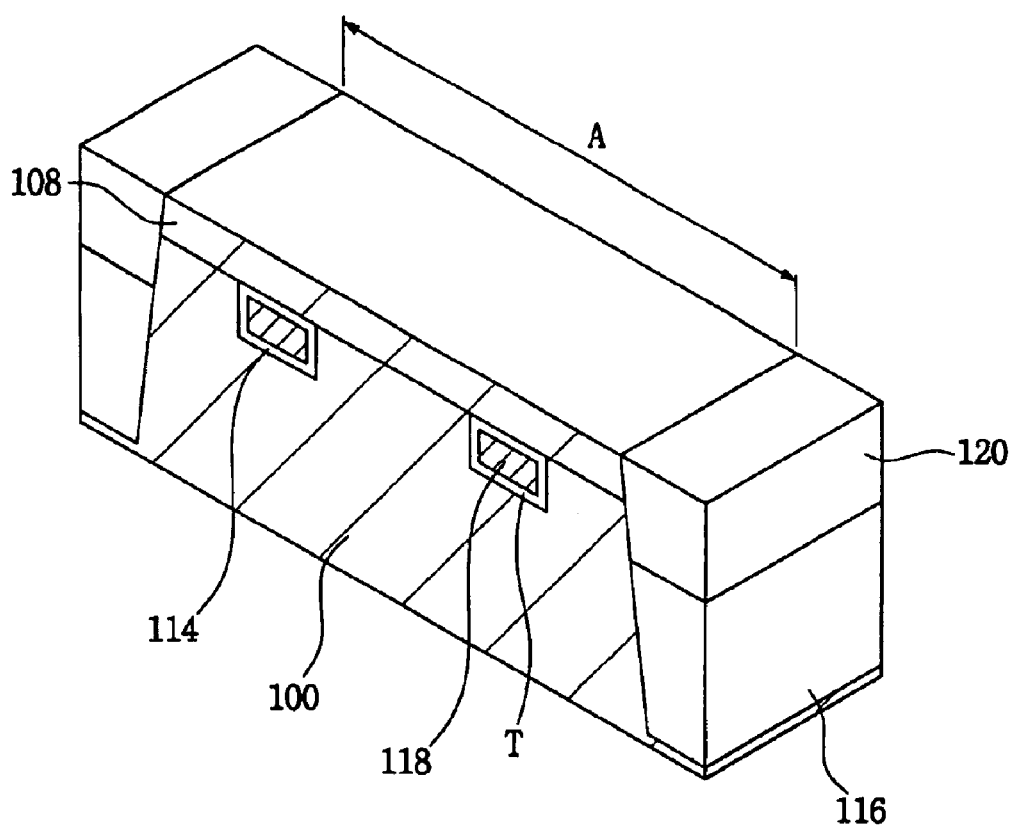
Figure 16B:
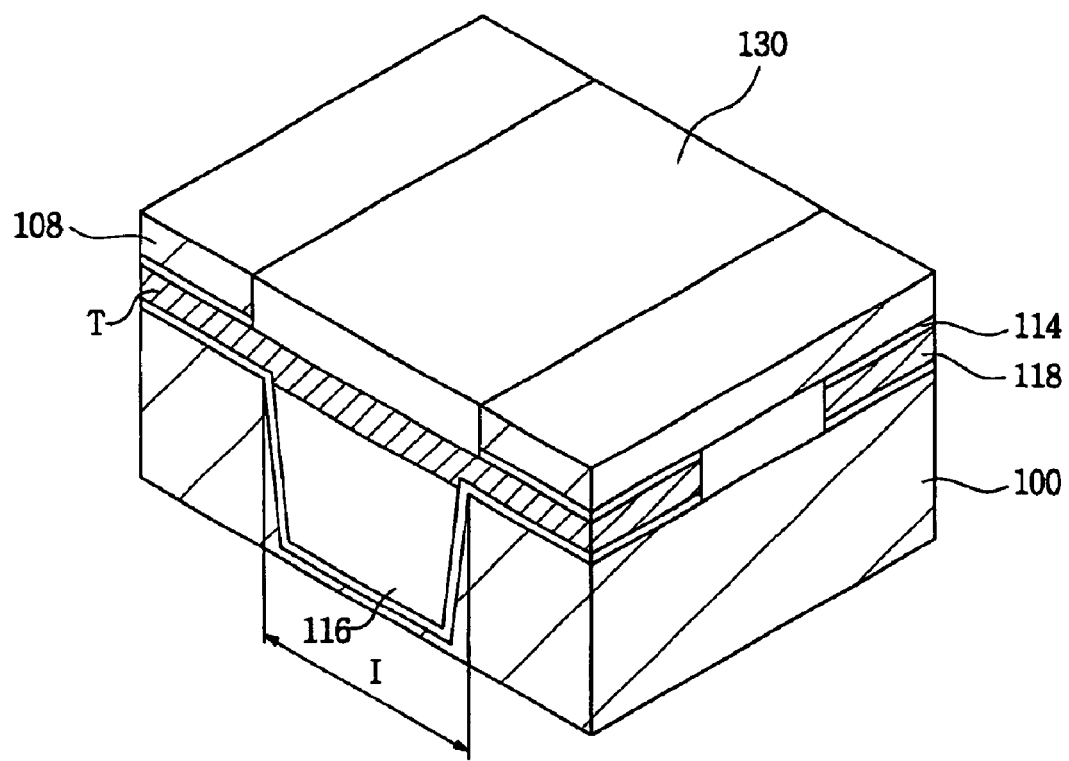

Referring to FIGS. 16A and 16B, an insulation material is formed on the bottom gate pattern 118 to fill up the trench 112. The insulation material may be substantially identical to that of the second insulation layer 120.

After removing the second mask pattern 110, the insulation material and the second insulation layer 120 are planarized until the silicon channel layer 108 is exposed. In some embodiments, the processes for removing the second mask pattern 110 and for planarizing the insulation material and the second insulation layer 120 may be performed using dry etching processes with adjusted etching recipes so that the second mask pattern 110, the insulation material and the second insulation layer 120 may be etched at a substantially identical etching rate. Alternatively, these processes may be carried out using a CMP processes in which the insulation material and the second insulation layer 120 are etched at a substantially identical etching rate. As a result, the silicon channel layer 108 is exposed in the active region while a third insulation layer 130 is formed in the trench 112. Accordingly, FIG. 16 illustrates forming an insulating layer on the substrate and, more specifically, forming a second insulating layer on the active region of the substrate, according to some embodiments of the invention.

Figure 17A:
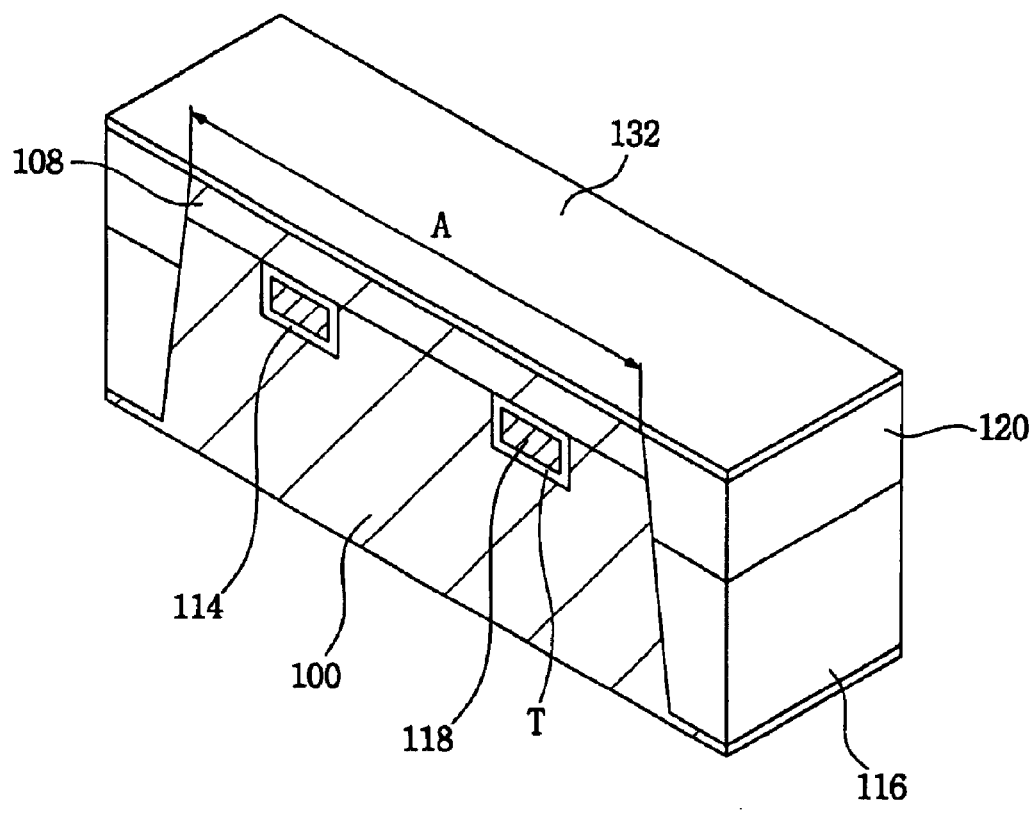
Figure 17B:
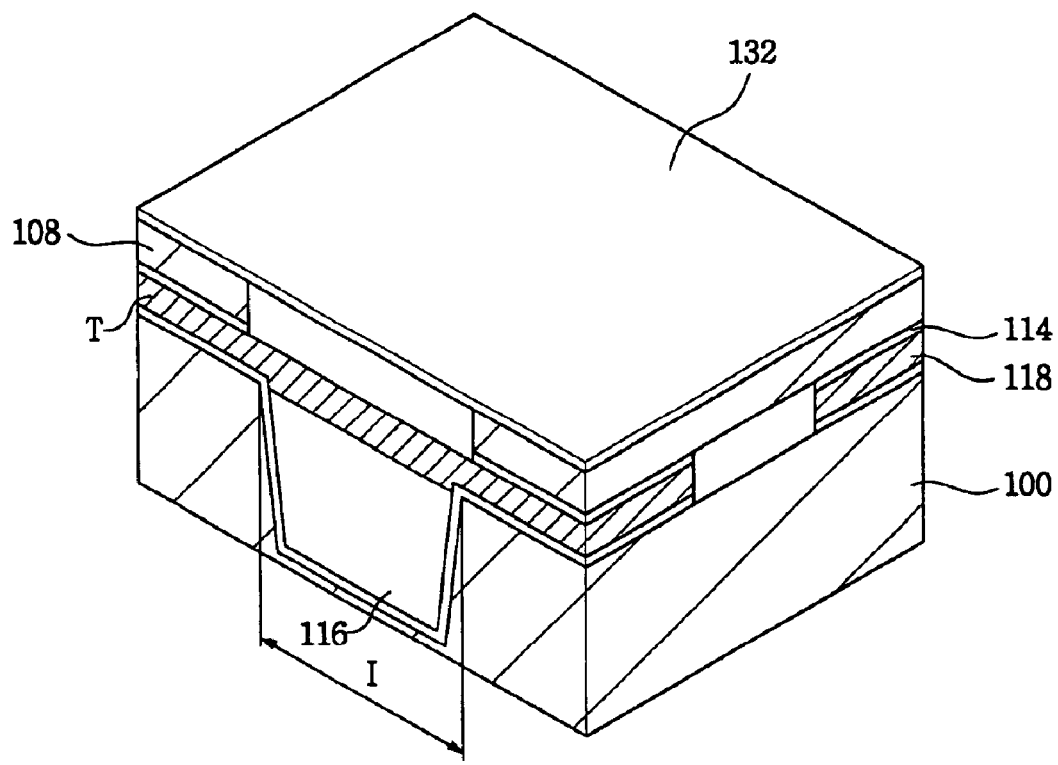

Referring to FIGS. 17A and 17B, a second silicon oxide layer 132 is formed over the silicon substrate 110 including the silicon channel layer 108 and the third insulation layer 130. The second silicon oxide layer 132 serves as a top gate oxide layer. For example, the second silicon oxide layer 132 may have a thickness of about 10 Å to about 100 Å.

Figure 18A:
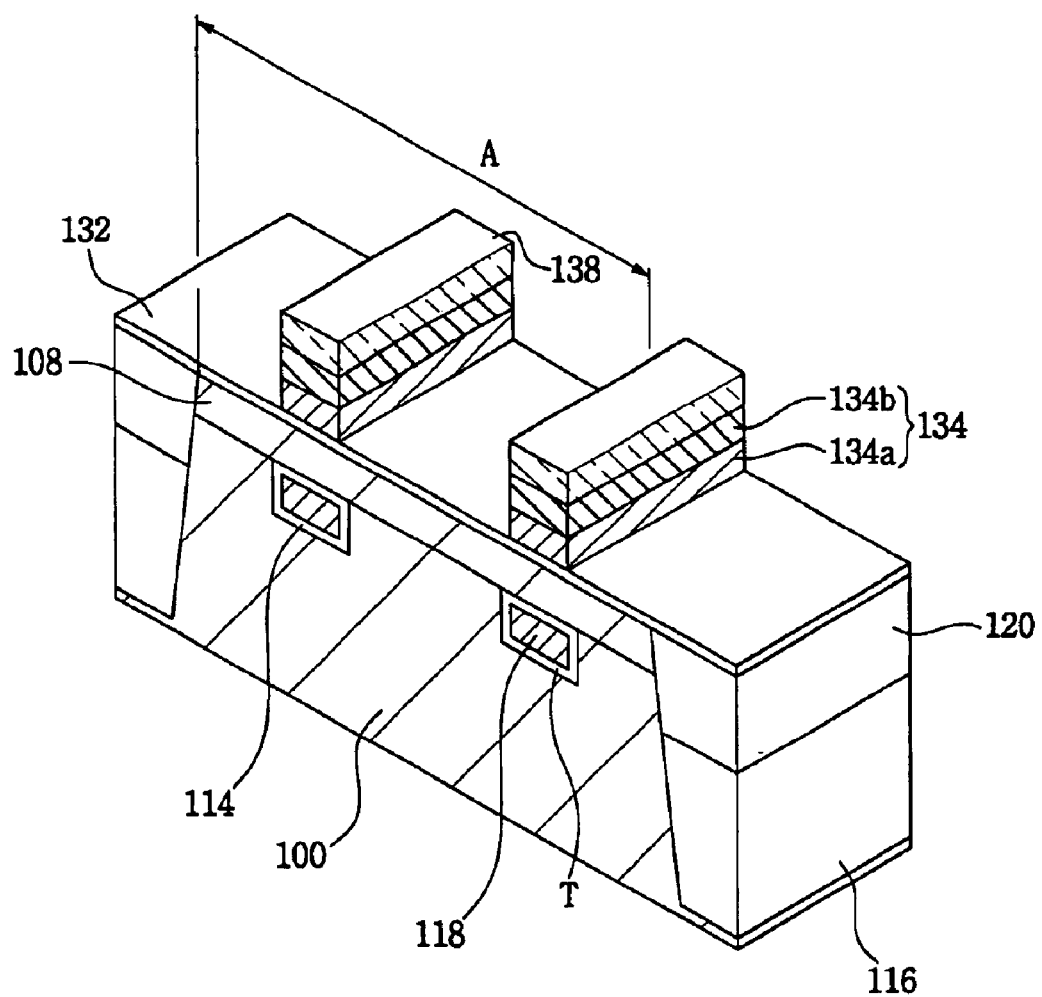
Figure 18B:
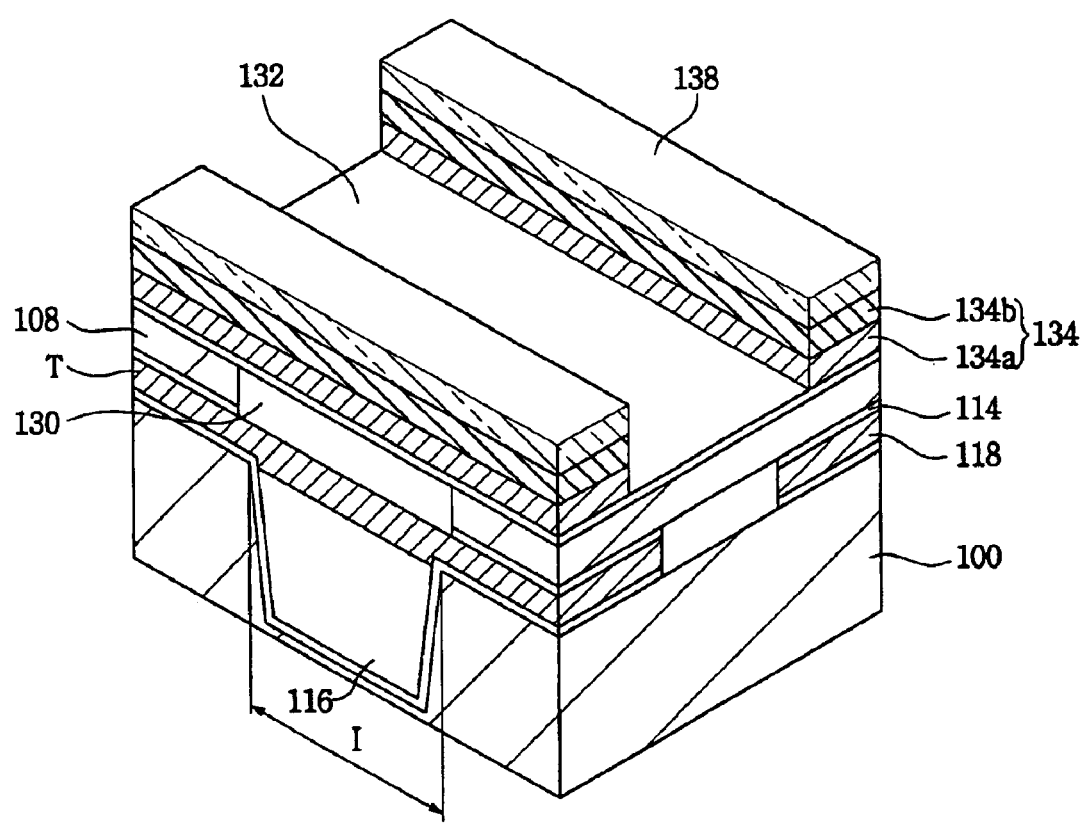

Referring to FIGS. 18A and 18B, a top gate conductive layer and a hard mask layer are formed on the second silicon oxide layer 132. The top gate conductive layer includes, for example, a polysilicon film, a composite film of polysilicon and metal silicide and/or a tungsten layer. The hard mask layer includes, for example, a silicon nitride film.

The hard mask layer is etched to form a hard mask pattern 138 on the top gate conductive layer. The top gate conductive layer is etched using the hard mask pattern 138 as an etching mask to thereby form a top gate pattern 134. The top gate pattern 134 is positioned parallel to the bottom gate pattern 118. In these embodiments, the top gate pattern 134 includes a polysilicon pattern 134a and a metal silicide pattern 134b formed on the polysilicon pattern 134a.

In some embodiments, the bottom gate pattern 118 has a resistance substantially identical to that of the top gate pattern 134. Thus, when driving voltages are applied to the bottom gate pattern 118 and the top gate pattern 134, respectively, channels are simultaneously formed to operate the transistor. The resistances of the bottom gate pattern 118 and the top gate pattern 134 can be matched by controlling their length and/or their composition. For example, when top gate pattern 134 is formed using a material having a resistance lower than that of the material of the bottom gate pattern 118, the bottom gate pattern 118 may have a length longer than that of the top gate pattern 134, thereby substantially matching their resistances.

As described above, a semiconductor device having a double gate electrode may be manufactured. In these embodiments, the double gate electrode has a tunnel structure T including the bottom gate pattern 118 that passes the isolation region I and the active region A of the substrate 100. The top gate pattern 134 of the double gate electrode is formed on the silicon channel layer 108. The top gate pattern 134 of these embodiments may have a construction substantially similar to that of a conventional single gate pattern. As a result, a process for forming the top gate pattern 134 and subsequent processes may be carried out in accordance with conventional semiconductor manufacturing processes.

Figure 19:
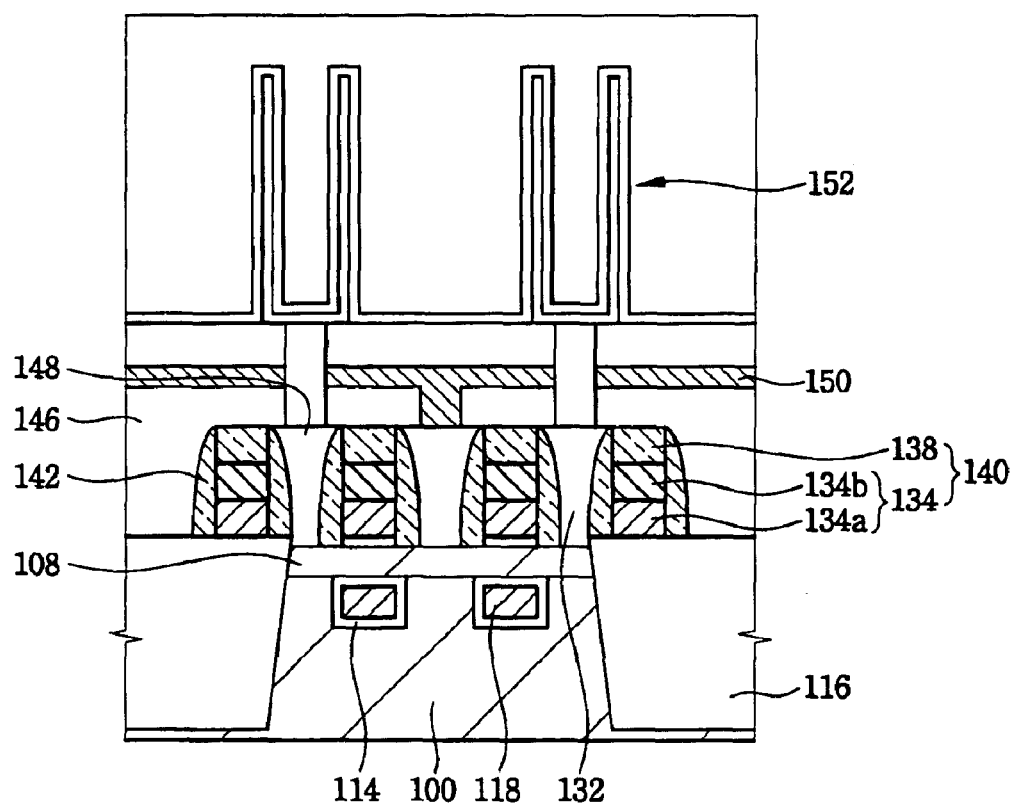
FIG. 19 is a cross-sectional view illustrating a DRAM device having a double gate electrode according to some embodiments of the present invention.

FIG. 19 is a cross-sectional view illustrating a DRAM device including a MOS transistor having a double gate electrode, according to embodiments of the present invention. In FIG. 19, a top gate structure 140 is formed on the silicon substrate 100. The top gate structure 140 includes the top gate pattern 134 and the hard mask pattern 138.

Referring to FIG. 19, a nitride spacer 142 is formed on the sidewall of the top gate structure 140. Then, impurities are implanted into the silicon channel layer 108 to form source/drain regions (not shown). A fourth insulation layer 146 is formed on the silicon channel layer 108 to cover the top gate structure 140. Pad electrodes 148 are formed between the top gate structures 140. The pad electrodes 148 are electrically connected to the source/drain regions. A bit line 150 is formed on the fourth insulation layer 146. The bit line 150 is electrically connected to the pad electrode 148 contacting the drain region. A capacitor 152 is formed over the bit line 150. The capacitor 152 is electrically connected to the pad electrode 148 contacting the source region.

As for a MOS transistor having the above-described double gate electrode, the channels are formed over the bottom gate pattern 118 and under the top gate pattern 134 when voltages are applied to the bottom gate pattern 118 and the top gate pattern 134. Therefore, the driving current of the transistor having the double gate electrode can be increased, for example, to twice as much as that of a conventional transistor having a single gate electrode. Additionally, channel length of the transistor having the double gate electrode can be increased without the need to augment the length of the gate electrode, thereby reducing or minimizing short channel effects of the transistor.

Figure 20A:
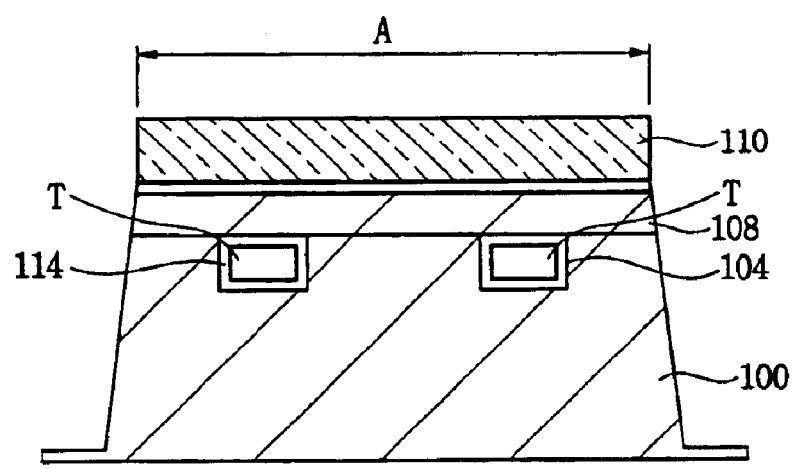
FIGS. 20A–22B are cross-sectional views illustrating methods for manufacturing a MOS device having a double gate electrode according to other embodiments of the present invention.

FIGS. 20A–22B are cross-sectional views illustrating methods for manufacturing a MOS device having a double gate electrode according to other embodiments of the present invention. FIGS. 20A, 21A and 22A are cross-sectional views illustrating methods for manufacturing the MOS device taken along line of A–A' in FIG. 7, and FIGS. 20B, 21B and 22B are cross-sectional views illustrating the method for manufacturing the DRAM device taken along line of B–B' in FIG. 7.

In these embodiments, methods for manufacturing the MOS device having the double gate electrode may be substantially identical to the above-described embodiments, except for a process of forming a bottom gate oxide layer.

As described above with reference to FIGS. 1–9B, a silicon channel layer 108 is formed on a silicon substrate 100, and then a trench 112 is formed in the silicon substrate 100 to define an isolation region and an active region. Subsequently, a bottom gate region 104 of a tunnel structure T is formed.

Figure 20B:
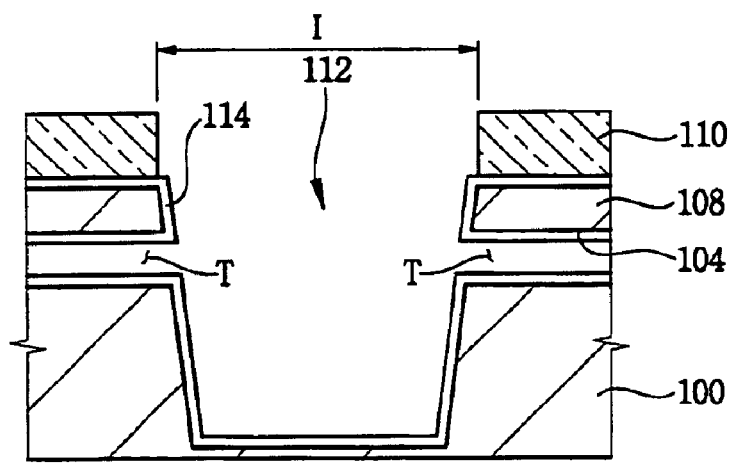

Referring to FIGS. 20A and 20B, a first silicon oxide layer 114 is formed in the bottom gate region 104 of the tunnel structure inside the trench 112. The first silicon oxide layer 114 can serve as a trench sidewall oxide layer that can cure damage to the trench 112 after performing subsequent etch processes. The first silicon oxide layer 114 can be formed through a thermal oxidation process in which a silicon oxide film is grown from silicon included in the silicon substrate 100.

Figure 21A:
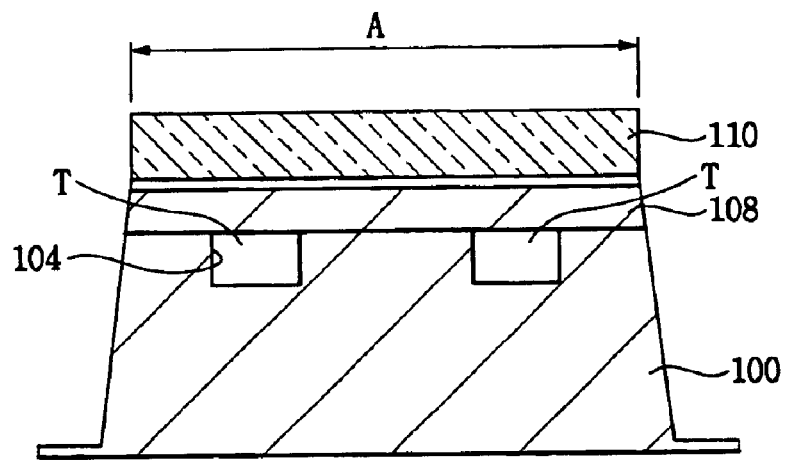
Figure 21B:
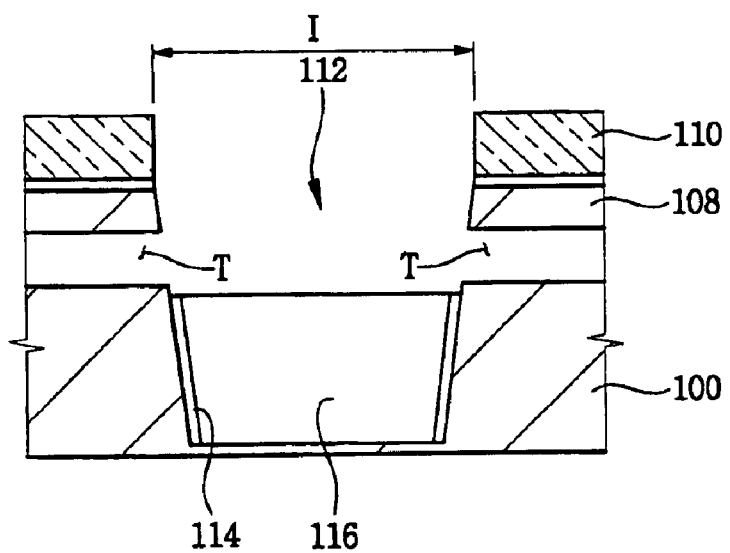

Referring to FIGS. 21A and 21B, an insulation material is formed on the first silicon oxide layer 114 to partially fill up the trench 112. The insulation material can include silicon oxide. Then, a first insulation layer 116 is formed through etching the insulation material. The first insulation layer 116 is positioned at a portion of the trench 112 beneath the bottom gate region 104 of the tunnel structure T.

When the insulation material is etched to form the first insulation layer 116, the first silicon oxide layer 114 formed in the bottom gate region 104 is simultaneously etched with the insulation material. Therefore, the bottom gate region 104 of the tunnel structure is exposed in accordance with the removal of the first silicon oxide layer 114.

Figure 22A:
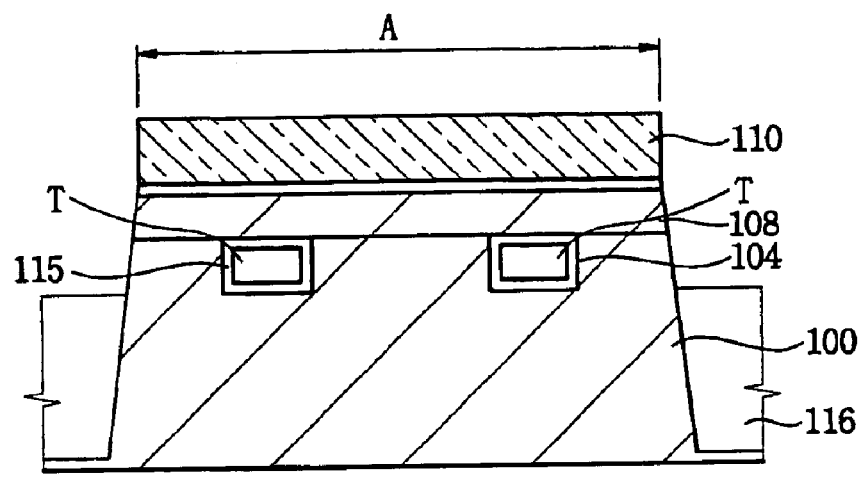
Figure 22B:
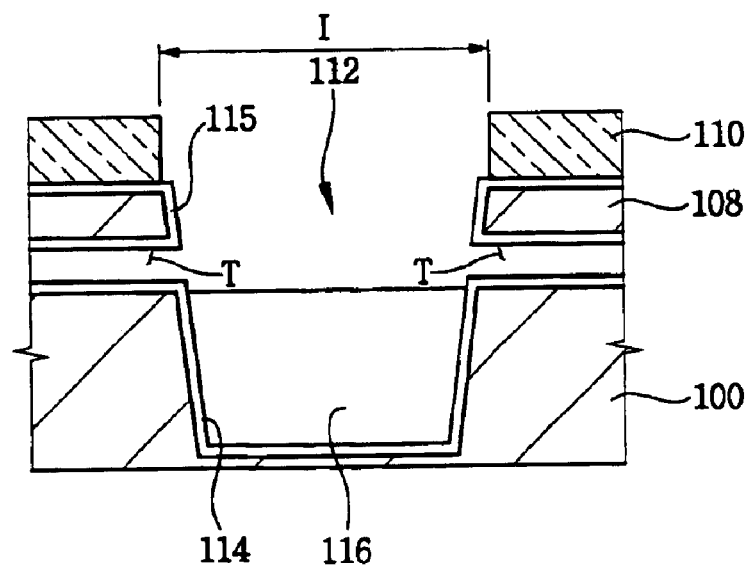

Referring to FIGS. 22A and 22B, a bottom gate oxide layer 115 is formed in the bottom gate region 104 and in the sidewall of the trench 112. The bottom gate oxide layer 115 includes silicon oxide. The bottom gate oxide layer 115 may be formed by a thermal oxidation in which silicon included in the silicon substrate 100 reacts with oxygen under an oxygen atmosphere. Alternatively, the bottom gate oxide layer 115 may be formed using a CVD process. For example, the bottom gate oxide layer 115 has a thickness of about 10 Å to about 100 Å.

When the bottom gate oxide layer 115 is formed using the above-described process, a failure such as break of a bottom gate pattern may be reduced or prevented since the bottom gate oxide layer 115 fills up the inside of the bottom gate region 104 of the tunnel structure along a horizontal direction relative to the silicon substrate 100. Also, because the bottom gate oxide layer 115 is formed in the bottom gate region 104 after completely removing the first silicon oxide layer 114 from the bottom gate region 104, the bottom gate oxide layer 115 may have uniform thickness with reduced or no damage thereto.

Then, a DRAM device having a double gate electrode may be manufactured according to the above-described processes with reference to FIGS. 11A–19.

As described above, the channel length of a transistor having a double gate electrode can be increased without the need to horizontally extend the length of the gate electrode. Thus, a short channel effect of the transistor can be reduced or minimized. In addition, a double gate electrode structure of some embodiments of the present invention may be substantially similar to that of the conventional single gate electrode structure. Hence, a DRAM device having the double gate electrodes can be manufactured without much variation of semiconductor manufacturing processes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming a double gate electrode comprising:
    forming a tunnel structure in an active region of a substrate that is defined by a trench positioned in an isolation region of the substrate, the tunnel structure extending substantially parallel to the substrate;
    forming a first insulation layer inside the tunnel structure and inside the trench;
    forming a bottom gate electrode on the first insulation layer inside the tunnel structure, the bottom gate electrode extending into the trench;
    forming a second insulation layer on the active region of the substrate; and
    forming a top gate electrode on the second insulation layer opposite the tunnel structure.

2. The method of claim 1, wherein the substrate comprises silicon and wherein forming the tunnel structure further comprises:
    forming a dummy bottom gate pattern on a bottom gate region of the substrate using a material having etching selectivity of more than about 1:10 relative to silicon;
    forming a silicon channel layer on the substrate having the dummy bottom gate pattern;
    forming the trench to expose the dummy bottom gate pattern by sequentially etching the silicon channel layer and the substrate; and
    forming the tunnel structure by selectively etching the dummy bottom gate pattern.

3. The method of claim 2, wherein the dummy bottom gate pattern includes $Si_{1-x}Ge_x$ wherein 0<X 1.

4. The method of claim 3, wherein the X is in a range of about 0.01 to about 0.5.

5. The method of claim 2, wherein the dummy gate pattern has a line shape.

6. The method of claim 2, wherein forming the dummy bottom gate pattern further comprises:
    forming a first mask pattern partially exposing the bottom gate region;
    etching the substrate using the first mask pattern as an etching mask;
    forming a silicon-germanium pattern by epitaxially growing silicon-germanium from the etched portion of the substrate; and
    removing the first mask pattern.

7. The method of claim 6, wherein the substrate is etched to a depth of about 50 Å to about 2,000 Å.

8. The method of claim 2, wherein the silicon channel layer is formed by epitaxially growing silicon from the substrate.

9. The method of claim 2, wherein forming the trench further comprises:
    forming a second mask pattern on the silicon channel layer to mask the active region; and
    etching the silicon channel layer and the substrate using the second mask pattern as an etching mask.

10. The method of claim 9, wherein the second mask pattern includes silicon nitride.

11. The method of claim 2, wherein selectively etching the dummy bottom gate pattern is performed using a wet etching process and/or a dry etching process.

12. The method of claim 1, wherein the first insulation layer has a thickness of about 10 Å to about 100 Å.

13. The method of claim 1, further comprising partially filling an insulation material in the trench before forming the bottom gate electrode.

14. The method of claim 13, wherein partially filling the insulation material comprises:
    forming a third insulation layer to fill up the trench; and
    etching the third insulation layer so that the third insulating layer partially remains in a portion of the trench beneath the bottom gate region while the first insulation layer remains on the tunnel structure.

15. The method of claim 13, wherein partially filling the insulation material comprises:

forming a third insulation layer to fill up the trench;

etching the third insulation layer so that the third insulation layer remains at a portion of the trench beneath the bottom gate region, wherein the first insulation layer on the tunnel structure is simultaneously etched; and forming a bottom gate oxide layer on the bottom gate region and in the trench structure.

16. The method of claim 15, wherein the bottom gate oxide layer has a thickness of about 10 Å to about 100 Å.

17. The method of claim 1, wherein forming the bottom gate electrode further comprises:

forming a conductive layer by depositing conductive material in the tunnel structure and on the substrate;

etching the conductive layer so that the conductive layer remains in the tunnel structure;

forming a fourth insulation layer on the substrate including the conductive layer;

polishing the fourth insulation layer and the conductive layer so that the fourth insulation layer and the conductive layer remain in the trench structure; and etching the conductive layer in the trench structure so that the conductive layer fills up the tunnel structure and extends into the trench.

18. The method of claim 17, wherein the conductive material includes at least one material selected from the group consisting of polysilicon, tungsten, tungsten silicide, titanium silicide, titanium nitride and tungsten nitride.

19. The method of claim 17, wherein etching the conductive layer further comprises:

forming an insulation material to fill the trench; and polishing the insulation material so that the insulation material remains in the trench.

20. The method of claim 1, further comprising, after forming the bottom gate electrode:

forming an insulation material to fill the trench.

21. The method of claim 1, wherein the bottom gate electrode and the top gate electrode are fabricated to have substantially identical resistance by adjusting lengths of the bottom and the top gate electrodes and/or varying materials included in the bottom and the top gate electrodes.

22. A method of claim 1, further comprising:

forming source and drain regions by implanting impurities into the substrate;

forming a bit line electrically connected to the source region; and forming a capacitor electrically connected to the drain region.

23. A method of forming a double gate electrode for a field effect transistor comprising:

forming in a substrate, a trench and a tunnel that extends from a sidewall of the trench parallel to the substrate;

forming an insulating coating inside the tunnel;

forming a bottom gate electrode within the insulating coating inside the tunnel;

forming an insulating layer on the substrate; and forming a top gate electrode on the insulating layer opposite the bottom gate electrode.

24. The method of claim 23, wherein forming in the substrate, the trench and the tunnel that extends from a sidewall of the trench parallel to the substrate, comprises:

forming a dummy bottom gate on the substrate;

forming a semiconductor channel region on the dummy bottom gate;

forming a trench that extends through a portion of the semiconductor channel region and the dummy bottom gate; and etching the dummy bottom gate to define the tunnel.

25. The method of claim 24, wherein the substrate comprises a first semiconductor and wherein forming the dummy bottom gate comprises:

forming a bottom gate trench in the substrate; and epitaxially growing a second semiconductor into the bottom gate trench from the first semiconductor.

26. The method of claim 25, wherein forming the semiconductor channel region on the dummy bottom gate comprises epitaxially growing the first semiconductor on the second semiconductor.

27. The method of claim 25, wherein the first semiconductor comprises a single element semiconductor and wherein the second semiconductor comprises a compound semiconductor.

28. The method of claim 23, wherein the following is performed prior to forming the bottom gate electrode:

filling the trench up to a floor of the tunnel; and wherein forming the bottom gate electrode comprises:

forming the bottom gate electrode within the insulating coating inside the tunnel and on the trench that is filled up to the floor of the tunnel.

* * * * *

UNITED STATES PATENT AND TRADEMARK OFFICE
CERTIFICATE OF CORRECTION

PATENT NO. : 6,900,102 B2  
APPLICATION NO. : 10/773022  
DATED : May 31, 2005  
INVENTOR(S) : Lee et al.

Page 1 of 1

It is certified that error appears in the above-identified patent and that said Letters Patent is hereby corrected as shown below:

Column 10,  
Line 22 should read -- gate pattern includes $Si_{1-x}Ge_x$ wherein $0<X\leq1$. --

Signed and Sealed this

Fifth Day of February, 2008

JON W. DUDAS  
*Director of the United States Patent and Trademark Office*